US011217714B2

United States Patent
Naito et al.

(10) Patent No.: US 11,217,714 B2
(45) Date of Patent: Jan. 4, 2022

(54) EVALUATION METHOD ON ANION PERMEABILITY OF GRAPHENE-CONTAINING MEMBRANE AND PHOTOELECTRIC CONVERSION DEVICE

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Katsuyuki Naito, Bunkyo (JP); Naomi Shida, Minato (JP); Yutaka Saita, Yokohama (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

(*) Notice: Subject to any disclaimer, the term of this patent is extended or adjusted under 35 U.S.C. 154(b) by 74 days.

(21) Appl. No.: 16/818,112

(22) Filed: Mar. 13, 2020

(65) Prior Publication Data
US 2020/0212231 A1      Jul. 2, 2020

Related U.S. Application Data

(63) Continuation of application No. PCT/JP2018/033968, filed on Sep. 13, 2018.

(51) Int. Cl.
H01L 31/0256     (2006.01)
H01L 31/0224     (2006.01)

(52) U.S. Cl.
CPC .. *H01L 31/0256* (2013.01); *H01L 31/022408* (2013.01)

(58) Field of Classification Search
None
See application file for complete search history.

(56) References Cited

U.S. PATENT DOCUMENTS 4,818,365 A    4/1989 Kinlen et al.
6,014,196 A    1/2000 Anzaki et al.
(Continued)

FOREIGN PATENT DOCUMENTS

CN    107037085 A    8/2017
JP     3-31753 A     2/1991
(Continued)

OTHER PUBLICATIONS

"A computational assessment of the permeability and salt rejection of carbon nanotube membranes and their application to water desalination" by Thomas et al. (Year: 2015).*
(Continued)

*Primary Examiner* — Evren Seven
(74) *Attorney, Agent, or Firm* — Oblon, McClelland, Maier & Neustadt, L.L.P.

(57) ABSTRACT

The present embodiment provide a method for evaluating anion permeability of a graphene-containing membrane and also to provide a photoelectric conversion device employing a graphene-containing membrane having controlled anion permeability. The method comprises:
preparing a measuring apparatus comprising an aqueous solution containing anions, a working electrode containing silver-metal, a counter electrode and a reference electrode; measuring the reaction current $I_0$ between the silver-metal and the anions while the electrode potential of the working electrode to the counter electrode is being periodically changed and driven under the condition that the electrodes are in contact with the aqueous solution;
measuring the reaction current $I_1$ under the condition that, instead of the working electrode, the graphene-containing membrane electrically connecting to the working electrode is in contact with the aqueous solution; and
(Continued)

comparing the currents $I_0$ and $I_1$ to evaluate anion-permeability of the graphene-containing membrane.

5 Claims, 3 Drawing Sheets

(56) References Cited

U.S. PATENT DOCUMENTS

| | | | |
|---|---|---|---|
| 10,074,822 B2 | 9/2018 | Seo et al. | |
| 2014/0174954 A1 | 6/2014 | Johnson et al. | |
| 2016/0118615 A1 | 4/2016 | Seo et al. | |
| 2017/0144107 A1* | 5/2017 | Garaj | B01D 69/10 |

FOREIGN PATENT DOCUMENTS

| | | |
|---|---|---|
| JP | 9-283866 A | 10/1997 |
| JP | 2012-204184 A | 10/2012 |
| JP | 2015-50442 A | 3/2015 |
| JP | 2016-86173 A | 5/2016 |
| JP | 2017-135379 A | 8/2017 |
| WO | WO 2014/188166 A1 | 11/2014 |

OTHER PUBLICATIONS

International Search Report dated Nov. 27, 2018 in PCT/JP2018/033968 filed Sep. 13, 2018 (with English Translation of Categories of Cited Documents), 6 pages.

Qin, X. et al., "Synthesis of silver nanowires and their applications in the electrochemical detection of halide," Talanta, vol. 84, 2011, pp. 673-678.

Bult, J.B. et al., "Role of Dopants in Long-Range Charge Carrier Transport for p-Type and n-Type Graphene Transparent Conducting Thin Films", ACS Nano, 2013, vol. 7, No. 8, pp. 7251-7261.

* cited by examiner

US 11,217,714 B2

EVALUATION METHOD ON ANION PERMEABILITY OF GRAPHENE-CONTAINING MEMBRANE AND PHOTOELECTRIC CONVERSION DEVICE

CROSS REFERENCE TO RELATED APPLICATIONS

This application is based upon and claims the benefit of priority from the prior International Patent Application No. PCT/JP2018/033968, filed on Sep. 13, 2018, the entire contents of which are incorporated herein by reference.

FIELD

Embodiments of the present disclosure relate to an evaluation method on anion permeability of a graphene-containing membrane and also to a photoelectric conversion device.

BACKGROUND

According to recent increasing of energy consumption, demand for alternative energy replacing fossil energy has been rising as measures to cope with global warming. As a source of the alternative energy, solar cells have been attracted the attention and hence progressively developed. They are studied for various practical applications. From a practical viewpoint, it is particularly desired to improve their flexibility and durability so that they can be installed on various places. However, single crystal silicon solar cells, which are the most basic solar cells, are expensive and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic EL devices and photosensors, have been also researched with the aim of improving their flexibility and durability. Those devices usually comprise indium-doped tin oxide (hereinafter, often referred to as "ITO") films as transparent electrodes. The ITO films are normally formed by sputtering or the like. In order that the ITO films can have high electroconductivity, it is necessary to carry out the sputtering procedure at a high temperature and to anneal thereafter the formed films at a high temperature. However, it is often the case that organic materials cannot be subjected to those procedures at a high temperature. Further, when the ITO films are installed in the devices, metal ions such as indium ion and/or halogen ions may intrude into the active elements such as the photoelectric conversion layers to impair the activity of the devices.

Meanwhile, it is sometimes the case that low-resistant and high-transparent ITO/Ag/ITO or silver nanowires are adopted as the transparent electrodes. However, in those electrodes, silver is often deteriorated by acids or halogens. In addition, silver tends to cause migration and, as a result, may react with water and the like to lower the transparency of the electrode or may migrate into the active elements to impair the activity of the devices.

There are also some cases in which graphene-containing membranes are adopted as the material of transparent electrode. However, although excellent in electroconductivity and stability, graphene-containing membranes are known to have various disadvantages.

DETAILED DESCRIPTION

Figure 1:
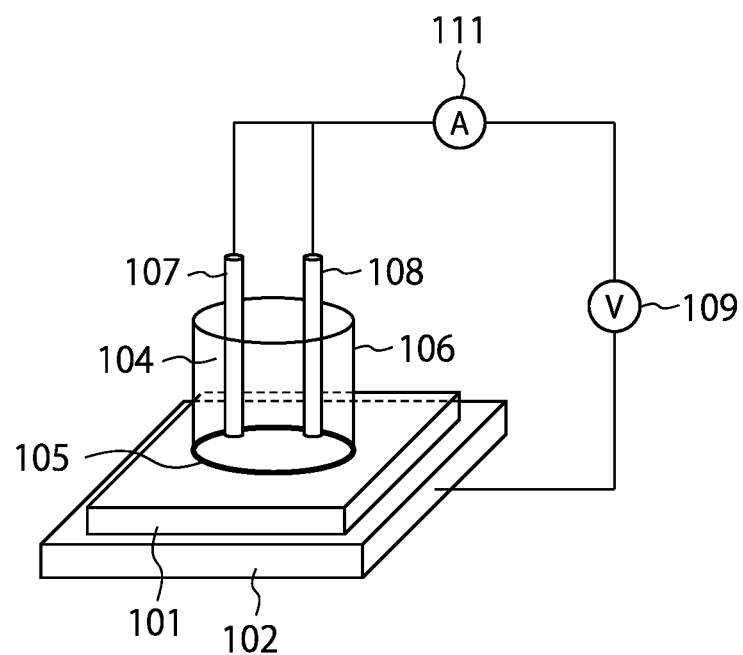
FIG. 1 is a schematic sketch illustrating the method according to the embodiment for measuring anion-permeability of a membrane structure.

The method according to the embodiment for evaluating anion-permeability of a graphene-containing membrane comprises:

(i) preparing a measuring apparatus which comprises an aqueous solution containing anions, a working electrode containing silver-metal, a counter electrode and a reference electrode and in which said working electrode, said counter electrode and said reference electrode are electrically connected through an external circuit;

(ii) measuring the reaction current $I_0$ between the silver-metal and the anions while the electrode potential of said working electrode to said counter electrode is being periodically changed and driven under the condition that said working electrode, said counter electrode and said reference electrode are in contact with said aqueous solution;

(iii) measuring the reaction current $I_1$ between the silver-metal and the anions while the electrode potential of said working electrode to said counter electrode is being periodically changed and driven under the condition that, instead of said working electrode, the graphene-containing membrane electrically connecting to said working electrode is in contact with said aqueous solution and that said working electrode is not directly in contact with said aqueous solution; and (iv) comparing the reaction currents $I_0$ in (ii) and $I_1$ in (iii) so as to evaluate anion-permeability of said graphene-containing membrane.

Also, the photoelectric conversion device according to the embodiment comprises two electrodes and a photoelectric conversion layer provided therebetween and further comprises a graphene-containing membrane provided between said photoelectric conversion layer and at least one of said electrodes;

wherein said graphene-containing membrane is characterized in that the reaction current $I_1$ in the following (iii) has a peak on the positive potential side, and also in that the integrated charge amount $Q_1$ of the reaction current $I_1$ on the positive potential side in the following (iii) is 20% or less based on the integrated charge amount $Q_0$ on the positive potential side in the following (ii), when evaluated by the method comprising:

(i) preparing a measuring apparatus which comprises an aqueous solution containing anions, a working electrode containing silver-metal, a counter electrode and a reference electrode and in which said working electrode, said counter electrode and said reference electrode are electrically connected through an external circuit;

(ii) measuring the reaction current $I_0$ between the silver-metal and the anions while the electrode potential of said working electrode to said counter electrode is being periodically changed and driven under the condition that said working electrode, said counter electrode and said reference electrode are in contact with said aqueous solution; and (iii) measuring the reaction current $I_1$ between the silver-metal and the anions while the electrode potential of said working electrode to said counter electrode is being periodically changed and driven under the condition that, instead of said working electrode, the graphene-containing membrane electrically connecting to said working electrode is in contact with said aqueous solution and that said working electrode is not directly in contact with said aqueous solution.

The embodiments will be described below in detail.

Embodiment 1

First, the method according to the first embodiment for evaluating anion-permeability of a graphene-containing membrane is explained with reference to FIG. 1.

In the method of the embodiment, the current $I_0$ in (ii) or $I_1$ in (iii) is measured under the condition that the graphene-containing membrane as the evaluating object is absent or present, respectively. Specifically, only the aqueous solution is subjected directly to cyclic voltammetry in (ii) while subjected to cyclic voltammetry through the graphene-containing membrane in (iii). Either measurement may be carried out first. FIG. 1 shows a schematic sketch of an apparatus by which the current $I_1$ in the presence of the graphene-containing membrane is measured in a manner according to one example of the embodiment.

The measuring apparatus for the evaluation comprises an aqueous solution 104 containing anions, a working electrode 102 containing silver-metal, a counter electrode 107 and a reference electrode 108. The working electrode, the counter electrode and the reference electrode are electrically connected through an external circuit. In FIG. 1, the external circuit is provided with a power supply 109 which applies potential between the working electrode and the counter electrode, and the circuit is also provided with an ammeter 111. Those electrodes, the power supply and the ammeter are electrically connected so that they can form a circuit similar to a potentiostat generally used in cyclic voltammetry. Accordingly, the reference electrode in the embodiment serves as a standard for accurately determining the potential of the working electrode.

The silver-metal contained in the working electrode 102 does not need to be simple substance of silver and may be a silver-containing alloy. Further, there are no particular restrictions on the shape of the silver-metal, and hence the working electrode may be in the shape of a silver-metal film or may be made of silver nanowires. The working electrode shown in FIG. 1 is in film shape, but the shape thereof is not limited to that. However, the working electrode is preferably in the shape of a film. That is because, if the electrode is in film shape, a homogeneous current can be used in the measurement since the evaluating object is also in the shape of a film.

In FIG. 1, the graphene-containing membrane 101 is sandwiched between the working electrode 102 and the aqueous solution 104. This means that one face of the graphene-containing membrane 101 is in contact with the working electrode 102 and the other face is in contact with the aqueous solution 104.

The graphene-containing membrane 101 is overlaid on and kept in contact with the working electrode 102, and thereby they are electrically connected.

In FIG. 1, the aqueous solution 104 is contained in the space surrounded by a cylinder 106 and the graphene-containing membrane 101. The aqueous solution 104 is thus in contact with the membrane 101 and electrically connected to the working electrode 102 through the membrane 101. In order to prevent the aqueous solution from leaking out, there may be a seal 105 between the cylinder 106 and the membrane 101.

In the apparatus described above, the reaction current $I_1$ between the silver-metal contained in the working electrode and the anions is measured with the ammeter 111 in the presence of the graphene-containing membrane 101 while the working electrode potential based on the reference electrode is being periodically changed.

Apart from the measurement of $I_1$, the above measurement is repeated except for removing the graphene-containing membrane 101 from the apparatus so that the aqueous solution 104 may be directly in contact with the working electrode 102, to measure the reaction current $I_0$ between the silver-metal contained in the working electrode and the anions in the absence of the graphene-containing membrane 101.

The above-measured reaction currents are generated by reactions explained below.

When the anions (e.g., halogen ions $X^-$) diffuse through the graphene-containing membrane 101 and reach the working electrode 102 containing silver-metal (Ag) under the condition that the applied potential exceeds the oxidation potential of the anions, the following reaction (1) occurs.

$$X^- + Ag \longrightarrow AgX + e^- \quad (1)$$

Subsequently, when the potential is reversely applied, the following reverse reaction (2) occurs.

$$AgX + e^- \longrightarrow X^- + Ag \quad (2)$$

The currents are generated by electron migration based on the above reactions. If the graphene-containing membrane has low anion-permeability, the reaction current $I_1$ is small. On the other hand, in the absence of the graphene-containing membrane, the reaction current $I_0$ serving as the standard is measured without receiving influence from the graphene-containing membrane. The reaction current $I_0$ depends substantially only on the concentration of the anions. From the comparison of those reaction currents, it is possible to evaluate the anion-permeability of the graphene-containing membrane.

There are generally two types of methods for measuring currents under application of potentials. One is a method, such as amperometry, in which the current is detected under application of a constant potential; and the other is a method, such as voltammetry, in which the current is detected under application of a periodically changed potential. In the embodiment, while the potential is being periodically changed, the responding change of the current is observed (i.e., cyclic voltammetry). However, there are some cases in which the current waveform responding to the time gradually changes. In those cases, when coming to change by 10% or less, the waveform is adopted. The reaction amount (current amount) of (1) can be estimated from the charge amount which can be obtained by integrating the current waveform on the positive side with respect to the time.

Further, the anion-permeability of the membrane as the measurement object can be evaluated from the comparison between the currents $I_0$ and $I_1$ in the absence and presence of the graphene-containing membrane, respectively. In view of analytical easiness, if voltammetry is used for the measurement, the measurement is preferably carried out according to, what is called, cyclic voltammetry, in which the potential is changed linearly to the time.

The applied potential is preferably within a range in which water is hardly electrolyzed to generate oxygen and hydrogen, namely, within a range of −500 to +800 mV (when the reference electrode is a silver-silver chloride electrode). In the cyclic voltammetry, the potential scan rate is preferably 2.5 to 50 mV/s, more preferably 10 to 25 mV/s.

Although properly adjusted according to the permeability of the membrane, the anion concentration in the aqueous solution is preferably 0.05 to 5 mass %.

Silver tends to react with oxygen to be oxidized. Accordingly, in order to prevent oxidization of silver-metal contained in the working electrode, the aqueous solution is preferably saturated with nitrogen gas and the measurement is preferably carried out in a nitrogen gas atmosphere. The measurement temperature is preferably 15° C. to 30° C.

In the present embodiment, the apparatus is preferably further equipped with such a protective film as prevents the aqueous solution from direct contact with the working electrode containing silver-metal. For example, in an embodied case different from one shown in FIG. 1, the working electrode, the counter electrode and the reference electrode are brought in contact with the aqueous solution contained in a vessel. In that system, after the graphene-containing membrane as the measurement object is overlaid on a part of the working electrode, the bare part of the working electrode can be covered with the protective film. In that embodied case, the method of the embodiment can be carried out by use of a versatile vessel instead of the cylinder 106 and the seal 105 in combination, in which there is fear of leakage of the aqueous solution.

As the anions in the present embodiment, halogen or hydroxide ions are preferably used. Halogen ions have high reactivity with silver, and the size and/or reaction potential thereof can be easily changed by selecting proper ions from chloride ions, bromide ions, iodide ions and the like. Hydroxide ions also have high reactivity with silver, and are suitable for evaluating the ion-permeability of the graphene-containing membrane under an alkaline condition.

There are no particular restrictions on the graphene-containing membrane as the object evaluated by the method of the present embodiment, but the membrane is preferably a graphene-containing one employed as a transparent electrode in a photoelectric conversion device.

The working electrode in the present embodiment contains silver-metal, which may be either pure silver or an alloy. The alloy is preferably silver with Pd, Pt, Au, Sn, Zn or Cu. The working electrode may be silver-metal in the shape of a film, a rod or a pad. Further, the silver-metal may be silver nanowires. In that case, the working electrode may consist of only silver nanowires or may be made of silver nanowires combined with electroconductive material.

If the working electrode is an ultrathin film of silver-metal, the average thickness thereof is preferably 2 nm to 20 nm. If thinner than 2 nm, the electrode tends to have such high electric resistance that it is often difficult to measure the reaction current with high accuracy. On the other hand, if the electrode is thicker than 20 nm, the transparency thereof may be impaired. The thickness is more preferably 3 nm to 15 nm inclusive. If the silver-metal is silver nano-wires, the average diameter thereof is preferably 20 to 200 nm. If it is smaller than 20 nm, the stability tends to be lowered. On the other hand, if it is larger than 200 nm, a dispersion thereof tends to be unstable. If the working electrode is in the shape of a film, the average thickness thereof is preferably 1 μm to 1 mm in view of processing and handling.

The thickness of the silver film or the diameter of the silver nanowires can be measured by observing the surface or section thereof with an electron microscope. Specifically, a planer image of the silver nanowires is observed to measure widths thereof. If one of the silver nanowires has an uneven width, the width is measured at three points. The average value can be obtained from the results at 50 measured points randomly selected.

The graphene-containing membrane as the measurement object can be produced in various manners.

There are some kinds of the graphene-containing membrane, and one of them is a monolayer graphene film. The monolayer graphene film can be produced according to, for example, chemical vapor deposition (CVD) method. Specifically, a graphene-containing membrane is formed on an underlying catalyst layer of Cu foil according to the CVD method in which a mixed gas of methane, hydrogen and argon is used as the reaction gas. The surface of the Cu foil is preferably beforehand subjected to anneal treatment so as to grow crystal grains on the Cu foil surface. The anneal treatment can be carried out by laser irradiation heating. The formed graphene-containing membrane is heated in a stream of argon mixed gas, and then cooled in a stream of argon gas. After a thermal transfer film is laminated by press-bonding onto the surface of the formed graphene-containing membrane, the layered body is immersed in ammonia alkaline copper(II) chloride etchant so that Cu may be dissolved to transfer the graphene monolayer onto the thermal transfer film. Thus, a monolayer graphene film can be produced.

It is also possible to produce a multilayer graphene film having a laminated structure of graphene-containing membranes. The multilayer graphene film can be formed by repeating the procedure of forming a monolayer graphene film so that the monolayer graphene films may be stacked.

The thus-formed graphene-containing membrane can be heat-transferred onto a film containing silver-metal.

It is also possible to produce a membrane containing graphene in which carbon atoms in the graphene skeleton are partly substituted with nitrogen atoms (hereinafter, this membrane is often referred to as "nitrogen-substituted graphene-containing membrane"). The graphene-containing membrane of this kind is preferred because interacting with the anions largely enough to reduce diffusion of the anions.

The above kind of graphene-containing membrane can be formed by the CVD method in which not only basic materials such as methane and hydrogen but also low molecular-weight nitrogen compounds such as ammonia, pyridine, methylamine, ethylenediamine and urea are used in combination.

Further, the nitrogen-substituted graphene-containing membrane can be formed by a method other than the above CVD method. For example, an aqueous dispersion of graphene oxide is applied by spin-coating on metal (e.g., Cu) surface to form a film, which is then subjected to heat treatment under a mixed gas atmosphere of ammonia, hydrogen and argon. By adopting this treatment, a part of carbon atoms in the graphene skeleton can be replaced with nitrogen atoms.

Furthermore, the nitrogen-substituted graphene-containing membrane can be formed by any of the following methods:

(i) an amine compound or hydrazine, and sodium borohydride or the like are added into an aqueous dispersion of graphene oxide, so as to reduce the oxide, and thereafter the dispersion is applied by spin-coating on a silver-containing film to form the membrane;

(ii) a thin film of graphene oxide is subjected to heat treatment with hydrazine and then dried, and thereafter transferred onto a PET film;

(iii) a thin film of unsubstituted graphene is treated in nitrogen-plasma to produce the membrane; and (iv) a copper substrate is irradiated with microwave under a mixed gas atmosphere of ammonia, methane, hydrogen and argon, to generate plasma.

Still further, it is yet also possible to produce a membrane containing graphene in which an alkyl chain-containing substituent is connected to the graphene skeleton. The graphene-containing membrane of this kind has such improved dispersibility in organic solvent as to be easily formed in film shape. In addition, because of the alkyl chain-containing substituent, it can reduce diffusion of the anions. This kind of graphene-containing membrane can be produced by making graphene oxide react with a reducing agent and a compound having both an alkyl chain and a functional group capable of reacting with a functional group, such as carboxyl, hydroxy or epoxy, of the graphene oxide. The alkyl chain preferably has 2 to 18 carbon atoms in view of dispersibility, may have a branched structure and may contain a hetero atom such as oxygen or nitrogen atom in the chain. The terminal group may be methyl, hydroxy, amino or carboxyl. It is possible to control the zeta potential of the graphene membrane by selecting the terminal group. If the alkyl chain-containing compound is reductive, the reducing agent can be omitted. As the reducing agent, hydrazine is preferred for producing a nitrogen-substituted graphene-containing membrane.

Yet further, it is still also possible to produce a membrane containing graphene in which carbon atoms in the graphene skeleton are partly substituted with boron atoms. This kind of graphene-containing membrane can be formed by the CVD method in which diborane, methane, hydrogen and argon are used as the mixed reaction gas.

Embodiment 2-1

Figure 2:
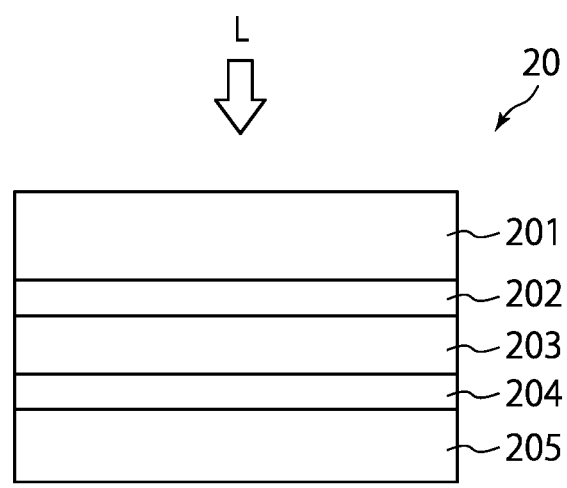
FIG. 2 is a schematic sectional view showing an electrochemical device (solar cell) according to the embodiment.

With reference to FIG. 2, the photoelectric conversion device according to an example of the second embodiment is explained below. FIG. 2 is a schematic sectional view showing a solar cell 20 (photoelectric conversion device) according to the present embodiment. The solar cell 20 is a device serving as a solar cell in which light energy such as sunlight L coming into the cell is converted into electric power. The solar cell 20 comprises a transparent electrode 201, a photoelectric conversion layer 203, and a first graphene-containing membrane 202 provided therebetween. In addition, it further comprises a counter electrode 205 and a second graphene-containing membrane 204 provided between the counter electrode 205 and the photoelectric conversion layer 203. FIG. 2 shows a device having two graphene-containing membranes, but the device may have only one of them.

The graphene-containing membranes 202 and 204 have specific anion permeability, which can be evaluated by a method comprising the following steps:

(i) preparing a measuring apparatus which comprises an aqueous solution containing anions, a working electrode containing silver-metal, a counter electrode and a reference electrode and in which said working electrode, said counter electrode and said reference electrode are electrically connected through an external circuit;

(ii) measuring the reaction current $I_0$ between the silver-metal and the anions while the electrode potential of said working electrode to said counter electrode is being periodically changed and driven under the condition that said working electrode, said counter electrode and said reference electrode are in contact with said aqueous solution;

(iii) measuring the reaction current $I_1$ between the silver-metal and the anions while the electrode potential of said working electrode to said counter electrode is being periodically changed and driven under the condition that, instead of said working electrode, the graphene-containing membrane electrically connecting to said working electrode is in contact with said aqueous solution and that said working electrode is not directly in contact with said aqueous solution. The reaction current $I_1$ in the above (iii) has a peak on the positive potential side and the integrated charge amount $Q_1$ on the positive potential side in the above (iii) is 20% or less, preferably 15% or less, further preferably 10% or less based on the integrated charge amount $Q_0$ on the positive potential side in the above (ii). The smaller the ratio is, the lower the anion permeability is and hence the longer the photoelectric conversion device can work.

In the embodiment, the membrane may contain graphene in which carbon atoms in the graphene skeleton are partly substituted with nitrogen atoms. The nitrogen-substituted graphene-containing membrane interacts with the anions largely enough to further reduce diffusion of the anions. In addition, it tends to have a low work function and hence is suitably used as the cathode of the device. The doped-nitrogen amount (N/C atomic ratio) can be determined by X-ray photoelectron spectroscopy (XPS), and is preferably 0.1 to 30 atom %, more preferably 1 to 10 atom %.

Also in the embodiment, the membrane may contain graphene in which an alkyl chain-containing substituent is connected to the graphene skeleton. If having the graphene skeleton linked with an alkyl chain-containing substituent, the graphene has such improved dispersibility in organic solvent as to be easily formed in film shape. In addition, because of the alkyl chain-containing substituent, it can reduce diffusion of the anions and, as a result, tends to extend the working lifetime of the device.

Still also in the embodiment, the electrodes in the device may contain silver. If they contain silver, it becomes possible to estimate effect of ion diffusion more accurately. When a silver electrode is adopted as the counter electrode 205, it is possible to employ a silver thin film of 50 nm to 1 μm thickness. The silver thin film can be formed by vapor deposition, sputtering or screen printing.

As the transparent electrode 201, a silver-containing electrode can be used. It may be a laminate film comprising an ultrathin silver film and electro-conductive metal oxide or may be made of silver nanowires.

The silver-metal may be either pure silver or a silver alloy. Preferred examples of the silver alloy include an alloy of silver with Pd, Pt, Au, Sn, Zn and/or Cu. The silver nanowires preferably have an average diameter of 20 to 200 nm. If it is less than 20 nm, the stability tends to be lowered. On the other hand, if it is more than 200 nm, the transparency tends to be lowered. The thickness of the ultrathin silver film and the diameter of the silver nanowires can be determined in the above-described manner.

The electroconductive metal oxide can be desirably selected from generally-known oxides. Examples thereof include: indium-doped tin oxide ITO, fluorine-doped tin oxide FTO, and aluminum-doped zinc oxide AZO. Those metal oxides contain amorphous structure, and the films thereof preferably have thicknesses of 30 to 200 nm. Since they have amorphous structure, it is easy to form even, continuous and flat films from them. If the thickness is less than 30 nm, the film tends to have large resistance. On the other hand, if the thickness is more than 200 nm, the film tends to have poor transparency and it tends to take a long time to form the film. The thickness is more preferably 35 to 100 nm, further preferably 40 to 70 nm. Among the above oxides, ITO is preferred because the zeta potential thereof in neutral pH is so near to zero as to have small interaction with cations and anions.

The ultrathin silver film preferably has a thickness of 2 to 20 nm. If it is less than 2 nm, the film tends to have large resistance. On the other hand, if it is more than 20 nm, the film tends to have poor transparency. The thickness is more preferably 3 to 15 nm, further preferably 5 to 10 nm.

The photoelectric conversion device according to the embodiment can further comprise a UV-cut layer or a gas-barrier layer. Examples of ultraviolet absorbers contained in the UV-cut layer include: benzophenones, such as, 2-hydroxy-4-methoxybenzophenone,
2,2-dihydroxy-4-methoxybenzophenone,
2-hydroxy-4-methoxy-2-carboxybenzophenone, and
2-hydroxy-4-n-octoxybenzophenone; benzotriazoles, such as,
2-(2-hydrxy-3,5-di-t-butylphenyl)benzotriazole,
2-(2-hydrxy-5-methylphenyl)benzotriazole, and
2-(2-hydrxy-5-t-octylphenyl)benzotriazole; and salicylic esters, such as, phenyl salicylate and p-octylphenyl salicylate. The absorbers are preferably capable of cutting UV light in the wavelength range of 400 nm or less.

The gas-barrier layer blocks preferably water vapor and oxygen, particularly preferably water vapor. This layer is preferably, for example, a film of inorganic substance such as SiN, $SiO_2$, SiC, $SiO_xN_y$, $TiO_2$ or $Al_2O_3$. Further, it may be an ultrathin glass sheet. There are no particular restrictions on the thickness of the gas-barrier layer, but the thickness is preferably 0.01 to 3000 µm, more preferably 0.1 to 100 µm. If it is less than 0.01 µm, the layer cannot serve fully as a barrier against gases. On the other hand, if the thickness is more than 3000 µm, the layer tends to be too thick to ensure flexibility or bendability. In view of those, the gas-barrier layer has a thickness of preferably 0.01 to 3000 µm, more preferably 0.1 to 100 µm. The gas-barrier layer has a water-vapor permeability (moisture permeability) of preferably $10^2$ to $10^{-6}$ g/m²·d, more preferably $10^1$ to $10^{-5}$ g/m²·d, further preferably $10^0$ to $10^{-4}$ g/m²·d. The moisture permeability can be measured according to ES 20208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion-beam assisted deposition; sputtering processes, such as, reactive sputtering, ion beam sputtering, ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

The substrate used in the device of the embodiment is, for example, a transparent substrate made of inorganic materials such as glass or organic materials such as PET, PEN, polycarbonate and PMMA. Preferred are flexible organic materials because they make the photoelectric conversion device of the embodiment rich in flexibility.

The photoelectric conversion layer 203 is a semiconductor layer that converts incident light energy into electric power to generate a current. The conversion layer 203 generally comprises a p-type semiconductor sub-layer and an N-type semiconductor sub-layer. As the photoelectric conversion layer, it is also possible to use: a laminate of p-type polymer and n-type material; an inorganic semiconductor such as perovskite type represented by $ABX_3$ (in which A is a monovalent cation, B is a divalent cation and X is a halogen ion), silicon semiconductor, InGaAs, GaAsd, chalcopyrite type, CdTe type, InP type or SiGe type; and a transparent semiconductor such as quantum dots-containing type or dye sensitizing type. Any of the above has enough high efficiency to reduce deterioration of output power.

In order to promote or block charge injection, the device can further comprise a buffer layer between the conversion layer 203 and the transparent electrode 201.

The counter electrode 205 is normally a nontransparent metal electrode, but may be a transparent electrode according to the embodiment. Further, the counter electrode 205 may be an ITO glass transparent electrode. In that case, although flexibility is sacrificed, the conversion device can utilize light energy at high efficiency. It is also possible to adopt a metal electrode made of stainless steel, copper, titanium, chromium, tungsten, gold, silver, molybdenum, tin and/or zinc. That electrode tends to have impaired transparency.

The device can furthermore comprise a second graphene-containing membrane, a charge buffer layer or a charge transport layer between the conversion layer 203 and the counter electrode 205.

The buffer or charge transport layer for anode may be, for example, a layer of vanadium oxide, PEDOT/PSS, P-type polymer, vanadium pentoxide ($V_2O_5$), 2,2',7,7'-tetrakis[N,N-di(4-methoxyphenyl)amino]-9,9'-spirobifluorene (hereinafter, referred to as "Spiro-OMeTAD"), nickel oxide (NiO), tungsten trioxide ($WO_3$) or molybdenum trioxide ($MoO_3$).

On the other hand, the buffer or charge transport layer for cathode may be, for example, a layer of lithium fluoride (LiF), calcium (Ca), 6,6'-phenyl-$C_{61}$-butyric acid methyl ester ($C_{60}$-PCBM), 6,6'-phenyl-$C_{71}$-butyric acid methyl ester (hereinafter, referred to as "C70-PCBM"), indene-C60 bisadduct (hereinafter, referred to as "ICBA"), cesium carbonate ($Cs_2CO_3$), titanium dioxide ($TiO_2$), poly[(9,9-bis(3'-(N,N-dimethylamino)propyl)-2,7-fluorene)-alt-2,7-(9,9-di-octyl-fluorene)] (hereinafter, often referred to as "PFN"), bathocuproine (hereinafter, often referred to as "BCP"), zirconium oxide (ZrO), zinc oxide (ZnO) or polyethyleneimine.

Further, the device can be equipped with a metal oxide layer between the conversion layer and the transparent electrode layer, in particular, adjacently to the graphene-containing membrane. The metal oxide layer is, for example, a brookite-type titanium oxide layer or a tin oxide layer. Titanium oxide is known to have three types of crystal structures, namely, rutile-type, anatase-type and brookite-type. Among them, it is preferred to employ a layer containing brookite-type titanium oxide in the embodiment. The brookite-type titanium oxide layer has an effect of inhibiting migration of halogen from the conversion layer to the electrode and also migration of metal ions from the electrode to the conversion layer. Consequently, it makes possible to extend the lifetime of the electrode and the device. The brookite-type titanium oxide layer preferably comprises nanoparticles of brookite-type titanium oxide, specifically, particles thereof having a mean size of 5 to 30 nm. Here, the mean size is determined with a grain-size distribution measuring apparatus. Those brookite-type nanoparticles are commercially available from, for example, Kojundo Chemical Lab. Co., Ltd. The tin oxide layer can be formed in a manner where a solution of tin oxide dissolved in n-butanol is applied and then heated under a high humid condition.

The photoelectric conversion device of the embodiment can have a structure sandwiched between transparent electrodes. The solar cell having that structure can efficiently utilize light incident from both sides. The energy conversion efficiency thereof is generally 5% or more.

The photoelectric conversion device according to the present embodiment can be used not only as a photocell or solar cell but also as a photosensor.

Embodiment 2-2

Figure 3:
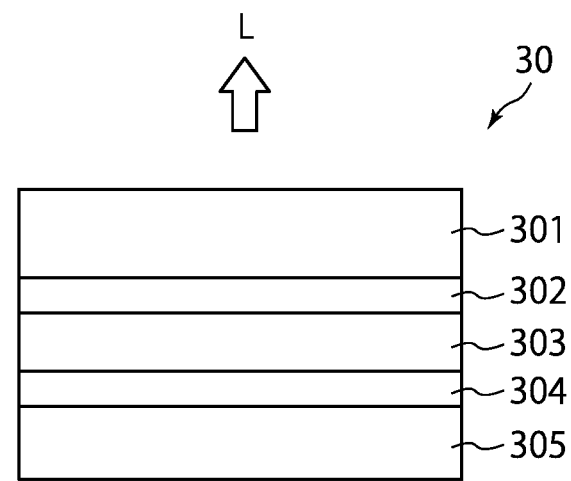
FIG. 3 is a schematic sectional view showing another electrochemical device (organic EL device) according to the embodiment.

With reference to FIG. 3, the photoelectric conversion device according to another example of the second embodiment is explained below. FIG. 3 is a schematic sectional view showing an organic EL device 30 (photoelectric conversion device) according to the present embodiment. The organic EL device 30 is a device serving as a light-emitting element in which electric energy inputted into the element is converted into light L. The organic EL device 30 comprises a transparent electrode 301, a photoelectric conversion layer 303, and a first graphene-containing membrane 302 provided therebetween. In addition, it further comprises a counter electrode 305 and a second graphene-containing membrane 304 provided between the counter electrode 305 and the photoelectric conversion layer 303. FIG. 3 shows a device having two graphene-containing membranes, but the device may have only one of them.

The graphene-containing membranes 302 and 304 have specific anion permeability, which can be evaluated by a method described above.

The photoelectric conversion layer 303 is an organic thin-film layer in which charges injected from the transparent electrode 301 and from the counter electrode 305 are recombined and thereby electric energy is converted into light. The conversion layer 303 normally comprises a p-type semiconductor sub-layer and a N-type semiconductor sub-layer. In order to promote or block charge injection, the device can further comprise a buffer layer between the conversion layer 303 and the counter electrode 305. Further, another buffer layer may be provided between the conversion layer 303 and the transparent electrode 301. The counter electrode 305 is normally a metal electrode, but may be a transparent electrode.

Examples of the material of the substrate in the device include: resins, such as, polyethylene terephthalate (hereinafter, referred to as "PET") and polyethylene naphthalate (hereinafter, referred to as "PEN"). The substrate is preferably subjected to flattening treatment.

Example 1

A layered structure of ITO (thickness: 45 nm)/silver alloy (thickness: 10 nm)/ITO (thickness: 45 nm) provided on a PET film of about 100 μm thickness is spin-coated with an aqueous solution of graphene oxide (manufactured by Graphenea), which is then reduced at 120° C. in hydrated hydrazine vapor to form a nitrogen-substituted graphene-containing membrane. From XPS measurement, the content of the nitrogen atoms is found to be 5% of the carbon atoms.

A titanium wire is fixed on the ITO/silver alloy/ITO with silver paste so that they can be electrically connected. The bonding part is protected with a silicone tape, and the back surface and edge of the PET film are also protected with a silicone tape. The thus-prepared sample is immersed in a 3 mass % aqueous sodium chloride solution and subjected to cyclic voltammetry (sample area: 0.85 cm$^2$). In the meantime, a sample prepared by only heating at 120° C. (sample area: 0.69 cm$^2$) as a sample not comprising the graphene-containing membrane, another sample prepared by heating at 120° C. in hydrazine hydrate vapor (sample area: 0.61 cm$^2$) and yet another sample prepared by spin-coating of graphene oxide and heating at 120° C. (sample area: 0.84 cm$^2$) are subjected to cyclic voltammetry in the same manner.

Figure 4:
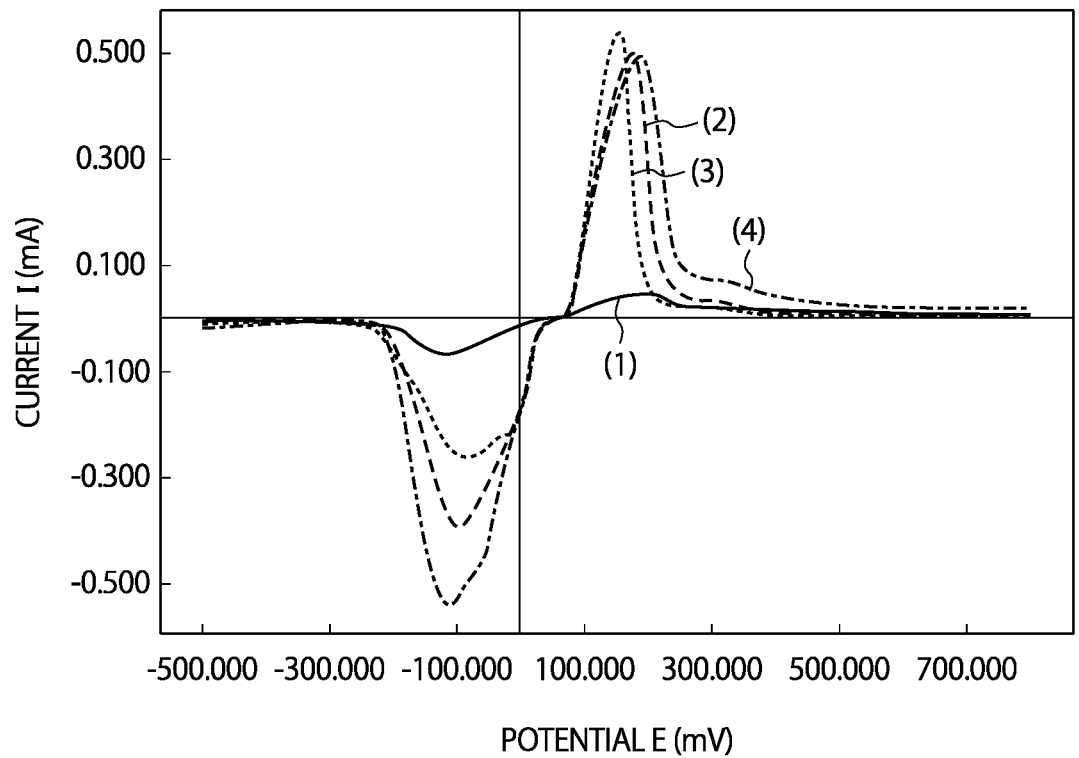
FIG. 4 shows cyclic voltammograms of Example 1.

FIG. 4 shows cyclic voltammograms measured at 12.5 mV/s under the same measurement conditions. From the waveform area on the positive potential side, the reaction amount between chloride ions and silver, namely, the integrated charge amount can be obtained. Here, the "waveform area" represents a total of charge when the potential is increased and decreased. The integrated charge amounts can be compared by comparing the waveform areas. Specifically, on the assumption that the waveform area corresponding to the integrated charge amount $Q_1$ of the sample (1) having the nitrogen-substituted graphene-containing membrane is regarded as 1, that corresponding to the integrated charge amount $Q_0$ of the sample (2), which does not have the substituted graphene-containing membrane and which is only heated at 120° C., is 7.8. Those of the sample (3), which is heated at 120° C. in hydrazine hydrate vapor, and of the sample (4), which is spin-coated with graphene oxide and heated at 120° C., are 7.9 and 9.1, respectively. Accordingly, the integrated charge amount of the sample having the nitrogen-substituted graphene-containing membrane is 13% (1/7.8) based on that of the sample not having the graphene-containing membrane. The reaction amount with chloride ions in the sample having the graphene oxide membrane is larger than that in the sample not having the graphene-containing membrane. The reason of that is thought to be because of the concentration effect.

Example 2

An aqueous solution of branched polyethylenimine is added into an aqueous dispersion of graphene oxide, and heated at 90° C. for 1 hour. Subsequently, after hydrated hydrazine is added, the solution is further heated at 90° C. for 1 hour. The obtained mixture is subjected to centrifugation at 12000 rpm, and the precipitates are collected. The precipitates are dispersed again in water, and then subjected to centrifugation at 12000 rpm to obtain precipitates. Those procedures are repeated twice to remove unreacted polyethylenimine and hydrated hydrazine. The resultant precipitates are dried and then dispersed in iso-propanol.

Thereafter, a layered structure of ITO (thickness: 45 nm)/silver alloy (thickness: 10 nm)/ITO (thickness: 45 nm) provided on a PET film of about 100 μm thickness is coated with the above iso-propanol dispersion with a bar-coater, and then dried at 120° C. From XPS measurement, the content of the nitrogen atoms is found to be 12% of the carbon atoms. In this case, the membrane contains many nitrogen atoms coming from the polyethylenimine. From IR spectroscopy, it is found that the graphene is linked with an alkyl chain.

A titanium wire is fixed on the ITO/silver alloy/ITO with silver paste so that they can be electrically connected. As shown in FIG. 1, the graphene-containing membrane is then brought into contact with a 3 mass % aqueous sodium chloride solution. In order to prevent the solution from leaking out, a seal is provided between the membrane and the vessel containing the solution. The cyclic voltammetry is then carried out (sample area: 12 cm$^2$). In the meantime, a sample prepared by only heating at 130° C. as a sample not comprising the graphene-containing membrane is subjected to the cyclic voltammetry in the same manner. The measurements of those samples are carried out under the same condition (25 mV/s). As a result, the reaction amount between chloride ions and silver in the sample having the graphene-containing membrane is less than 3% based on that in the sample not comprising the graphene-containing membrane.

Example 3

A Cu foil is irradiated with laser light to heat the surface, and annealed to grow crystal grains. The thus-treated Cu foil is employed as an underlying catalyst layer, on which a planar monolayer nitrogen-substituted graphene-containing membrane is formed by the CVD method in which ammonia, methane, hydrogen and argon (15:60:65:200 ccm) are used as a mixed reaction gas at 1000° C. for 5 minutes. In this procedure, the formed membrane is almost a monolayer nitrogen-substituted graphene-containing one but, depending on the conditions, partly a bi- or more-layered nitrogen-substituted graphene-containing membrane may be formed. After treated at 1000° C. for 5 minutes in a stream of ammonia-argon mixed gas, the formed membrane is cooled in a stream of argon gas. The monolayer nitrogen-substituted graphene-containing membrane and a thermal transfer film (thickness: 150 μm) are pressed and adhered together, and then immersed in ammonia alkaline copper(II) chloride etchant so that Cu may be dissolved to transfer the monolayer nitrogen-substituted graphene-containing membrane onto the thermal transfer film. The same procedure is repeated four times to obtain a multilayer nitrogen-substituted graphene-containing membrane.

Subsequently, the thermal transfer film is laminated on a layered structure of ITO (thickness: 45 nm)/silver alloy (thickness: 10 nm)/ITO (thickness: 45 nm) provided on a PET film of about 100 μm thickness, and then heated so as to transfer the graphene-containing membrane. From XPS measurement, the nitrogen content is found to be 1 to 2 atom % under that condition.

A titanium wire is fixed on the ITO/silver alloy/ITO with silver paste so that they can be electrically connected. As shown in FIG. 1, the graphene-containing membrane is then brought into contact with a 3 mass % aqueous sodium chloride solution. In order to prevent the solution from leaking out, a seal is provided between the membrane and the vessel containing the solution. The cyclic voltammetry is then carried out (sample area: 12 cm$^2$). In the meantime, a sample prepared by only heating at 100° C. as a sample not comprising the graphene-containing membrane is subjected to the cyclic voltammetry in the same manner. The measurements of those samples are carried out under the same condition (25 mV/s). As a result, the reaction amount between chloride ions and silver in the sample having the graphene-containing membrane is less than 1% based on that in the sample not comprising the graphene-containing membrane.

Example 4

The procedure of Example 2 is repeated except that the iso-propanol dispersion of graphene obtained in Example 2 is applied with a bar coater on a coating film of silver nanowires having an average diameter of 40 nm and that the concentration of the aqueous sodium chloride solution is changed into 1 mass %, to evaluate the chloride ion permeability. The coating film of silver nanowires is formed on a PET film of about 100 μm thickness. The measurements are carried out under the same condition (25 mV/s). As a result, the reaction amount between chloride ions and silver in the sample having the graphene-containing membrane is less than 4% based on that in the sample not comprising the graphene-containing membrane.

Example 5

Figure 5:
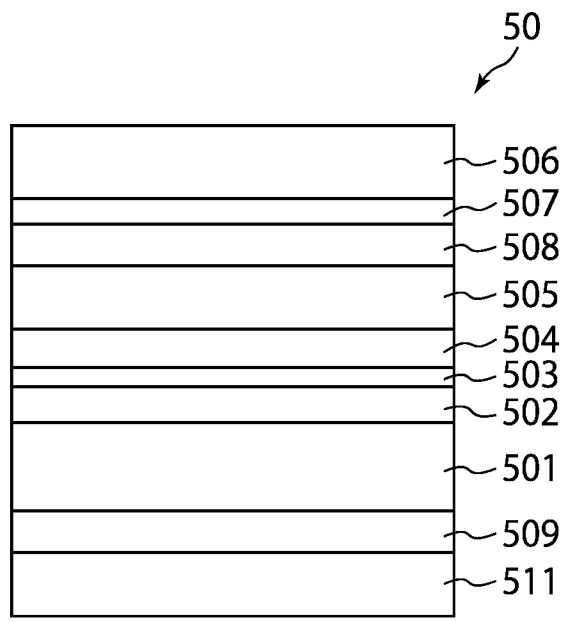
FIG. 5 is a schematic sectional view showing a solar cell of Example 5.

A solar cell 50 shown in FIG. 5 is produced.

In the same manner as in Example 1, a layered structure 502 of ITO (thickness: 45 nm)/silver alloy (thickness: 10 nm)/ITO (thickness: 45 nm) provided on a PET film 501 of about 100 μm thickness is spin-coated with an aqueous solution of graphene oxide (manufactured by Graphenea), which is then reduced at 120° C. in hydrated hydrazine vapor to form a nitrogen-substituted graphene-containing membrane 503. From XPS measurement, the content of the nitrogen atoms is found to be 5% of the carbon atoms. On the membrane 503, a toluene solution of $C_{60}$-PCBN is applied with a bar coater and then dried to form an electron transport layer 504. Subsequently, a chlorobenzene solution containing poly(3-hexyl-thiophene-2,5-diyl) (hereinafter, referred to as "P3HT") and $C_{60}$-PCBM is applied with a bar-coater, and dried at 100° C. for 20 minutes to form a photoelectric conversion layer 505.

One surface of a stainless steel foil 506 provided with an insulating ceramic film formed on the other surface is treated with diluted hydrochloric acid to remove the surface oxide film, and then spin-coated with an aqueous solution of graphene oxide to form a graphene oxide membrane, which is thereafter reduced at 120° C. in hydrated hydrazine vapor to form a nitrogen-substituted graphene-containing membrane 507.

On the nitrogen-substituted graphene-containing membrane 507, an aqueous PEDOT·PSS solution containing sorbitol is applied with a bar coater and dried at 100° C. for 30 minutes to form an adhesive layer 508 containing PEDOT·PSS (thickness: 50 nm).

The thus-prepared laminate is then so adhered at 90° C. on the photoelectric conversion layer 505 that the above adhesive layer 508 may be in contact with the conversion layer 505. UV-cut ink containing 2-hydroxy-4-methoxybenzophenone is screen-printed on the surface of the PET film to form a UV-cut layer 509, on which a silica film is then formed by vacuum deposition to form a gas-barrier layer 511. In this way, a solar cell 50 is produced.

The thus-produced solar cell shows an energy conversion efficiency of 5% or more under 1 SUN solar light illumination, and the efficiency deteriorates by less than 5% even after the solar cell is left outdoor for 1 month.

Example 6

In the same manner as in Example 2, an aqueous solution of branched polyethylenimine is added into an aqueous dispersion of graphene oxide, and heated at 90° C. for 1 hour. Subsequently, after hydrated hydrazine is added, the solution is further heated at 90° C. for 1 hour. The obtained mixture is subjected to centrifugation at 12000 rpm, and the precipitates are collected. The precipitates are dispersed again in water, and then subjected to centrifugation at 12000 rpm to obtain precipitates. Those procedures are repeated twice to remove unreacted polyethylenimine and hydrated hydrazine. The resultant precipitates are dried and then dispersed in iso-propanol.

Thereafter, a layered structure of ITO (thickness: 45 nm)/silver alloy (thickness: 10 nm)/ITO (thickness: 45 nm) provided on a PET film of about 100 μm thickness is coated with the above iso-propanol dispersion with a bar-coater, and then dried at 120° C. to obtain a nitrogen-substituted graphene-containing membrane. From XPS measurement, the content of the nitrogen atoms is found to be 12% of the carbon atoms. In this case, the membrane contains many nitrogen atoms coming from the polyethylenimine. From IR spectroscopy, it is found that the graphene is linked with an alkyl chain.

On the above graphene-containing membrane, a toluene solution of $C_{60}$-PCBN is applied with a bar coater and then dried to form an electron transport layer. Subsequently, a chlorobenzene solution containing P3HT- and $C_{60}$-PCBM is applied with a bar-coater, and dried at 100° C. for 20 minutes to form a photoelectric conversion layer.

One surface of a stainless steel foil provided with an insulating ceramic film formed on the other surface is treated with diluted hydrochloric acid to remove the surface oxide film, and then spin-coated with the above iso-propanol dispersion of nitrogen-substituted graphene to form a nitrogen-substituted graphene-containing membrane. Thereafter, the procedure of Example 5 is repeated to produce a solar cell.

The thus-produced solar cell shows an energy conversion efficiency of 5% or more under 1 SUN solar light illumination, and the efficiency deteriorates by less than 2% even after the solar cell is left outdoor for 1 month.

Comparative Example 1

The procedure of Example 5 is repeated except for not producing the nitrogen-substituted graphene-containing membranes 503 and 507, to produce a solar cell. The obtained solar cell shows an energy conversion efficiency of 5% or more under 1 SUN solar light illumination, but the efficiency deteriorates by 80% or more after the solar cell is left outdoor for 1 month.

Example 7

Figure 6:
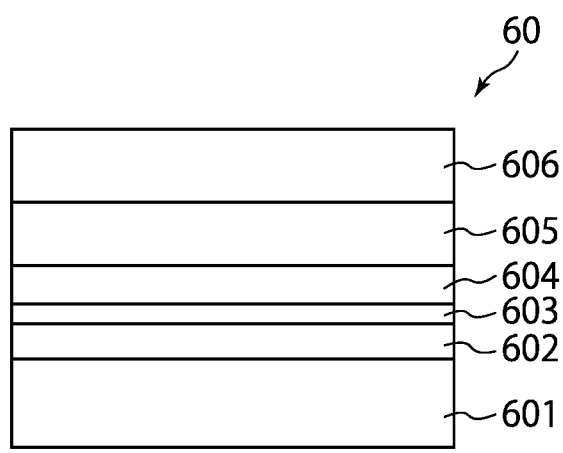
FIG. 6 is a schematic sectional view showing an organic EL device of Example 7.

An organic EL device 60 shown in FIG. 6 is produced.

In the same manner as in Example 1, a layered structure 602 of ITO (thickness: 45 nm)/silver alloy (thickness: 10 nm)/ITO (thickness: 45 nm) provided on a PET film 601 of about 100 μm thickness is spin-coated with an aqueous solution of graphene oxide (manufactured by Graphenea), which is then reduced at 120° C. in hydrated hydrazine vapor to form a nitrogen-substituted graphene-containing membrane 603. From XPS measurement, the content of the nitrogen atoms is found to be 5% of the carbon atoms. On the membrane 603, tris(8-hydroxyquinoline)-aluminum ($Alq_3$) (40 nm) is vapor-deposited to form a photoelectric conversion layer 604. Further, N,N'-di-1-naphthyl-N,N'-diphenyl-1,1'-biphenyl-4,4'-diamine (hereinafter, referred to as "NPD") is vapor-deposited thereon in a thickness of 30 nm to form a hole transport layer 605. Furthermore, a gold electrode 606 is formed thereon by sputtering. Finally, the boundary is sealed to produce an organic EL device.

The obtained organic EL device hardly deteriorates in output light. Specifically, even after continuous running for 1000 hours, the output falls by 5% or less.

Example 8

A transparent organic EL device is produced.

In the same manner as in Example 1, a layered structure of ITO (thickness: 45 nm)/silver alloy (thickness: 10 nm)/ITO (thickness: 45 nm) provided on a PET film of about 100 μm thickness is spin-coated with an aqueous solution of graphene oxide (manufactured by Graphenea), which is then reduced at 120° C. in hydrated hydrazine vapor to form a nitrogen-substituted graphene-containing membrane. From XPS measurement, the content of the nitrogen atoms is found to be 5% of the carbon atoms. On the graphene, tris(8-hydroxyquinoline)aluminum ($Alq_3$) (40 nm) is vapor-deposited to form a photoelectric conversion layer serving as a light-emitting layer. Further, NPD is vapor-deposited thereon in a thickness of 30 nm to form a hole transport layer. Furthermore, a film of a-ITO (40 nm)/silver (10 nm)/a-ITO (50 nm) is formed thereon by sputtering. Finally, the boundary of the device is sealed to produce an organic EL device.

The obtained organic EL device hardly deteriorates in output light. Specifically, even after continuous running for 1000 hours, the output falls by 6% or less.

Comparative Example 2

The procedure of Example 7 is repeated except for not forming the nitrogen-substituted graphene-containing membrane, to produce an organic EL device. The obtained organic EL device so deteriorates that the output falls to 80% or less after continuous running for 1000 hours.

Example 9

A layered structure of ITO (thickness: 45 nm)/silver alloy (thickness: 10 nm)/ITO (thickness: 45 nm) provided on a PET film of about 100 μm thickness is spin-coated with an aqueous solution of graphene oxide (manufactured by Graphenea), which is then reduced at 80° C. in hydrated hydrazine vapor to form a nitrogen-substituted graphene-containing membrane. From XPS measurement, the content of the nitrogen atoms is found to be 3% of the carbon atoms.

A titanium wire is fixed on the ITO/silver alloy/ITO with silver paste so that they can be electrically connected. The bonding part is protected with a silicone tape, and the back surface and edge of the PET film are also protected with a silicone tape. The thus-prepared sample is immersed in a 3 mass % aqueous sodium chloride solution and subjected to cyclic voltammetry. In the meantime, a sample prepared by only heating at 80° C. as a sample not comprising the graphene-containing membrane is subjected to cyclic voltammetry in the same manner. The measurements of those samples are carried out under the same condition (25 mV/s). As a result, the reaction amount between chloride ions and silver in the sample having the graphene-containing membrane is 20% based on that in the sample not comprising the graphene-containing membrane.

Thereafter, the procedure of Example 8 is repeated to produce an organic EL device. The obtained organic EL device hardly deteriorates in output light. Specifically, even after continuous running for 1000 hours, the output falls by 10% or less.

Comparative Example 3

A layered structure of ITO (thickness: 45 nm)/silver alloy (thickness: 10 nm)/ITO (thickness: 45 nm) provided on a PET film of about 100 μm thickness is spin-coated with an aqueous solution of graphene oxide (manufactured by Graphenea), which is then reduced at 60° C. in hydrated hydrazine vapor to form a nitrogen-substituted graphene-containing membrane. From XPS measurement, the content of the nitrogen atoms is found to be 2% of the carbon atoms.

A titanium wire is fixed on the ITO/silver alloy/ITO with silver paste so as to ensure electric conduction. The bonding part is protected with a silicone tape, and the back surface of the PET film is also protected with a silicone tape. The thus-prepared sample is immersed in a 3 mass % aqueous sodium chloride solution and subjected to cyclic voltammetry. In the meantime, a sample prepared by only heating at 60° C. as a sample not comprising the graphene-containing membrane is subjected to cyclic voltammetry in the same manner. The measurements of those samples are carried out under the same condition (25 mV/s). As a result, the reaction amount between chloride ions and silver in the sample having the graphene-containing membrane is 25% based on that in the sample not comprising the graphene-containing membrane.

Thereafter, the procedure of Example 8 is repeated to produce an organic EL device. The obtained organic EL device so deteriorates that the output falls to 50% or less after continuous running for 1000 hours.

Example 10

In the same manner as in Example 2, an aqueous solution of branched polyethylenimine is added into an aqueous dispersion of graphene oxide, and heated at 90° C. for 1 hour. Subsequently, after hydrated hydrazine is added, the solution is further heated at 90° C. for 1 hour. The obtained mixture is subjected to centrifugation at 12000 rpm, and the precipitates are collected. The precipitates are dispersed again in water, and then subjected to centrifugation at 12000 rpm to obtain precipitates. Those procedures are repeated twice to remove unreacted polyethylenimine and hydrated hydrazine. The resultant precipitates are dried and then dispersed in iso-propanol.

Silver nanowires having an average diameter of 40 nm are applied with a bar coater on a PET film of about 100 μm thickness. Further, the above iso-propanol dispersion is applied thereon with a bar-coater and then dried at 120° C. to obtain a nitrogen-substituted graphene-containing membrane. From XPS measurement, the content of the nitrogen atoms is found to be 12% of the carbon atoms. In this case, the membrane contains many nitrogen atoms coming from the polyethylenimine. From IR spectroscopy, it is found that the graphene is linked with an alkyl chain.

On the above graphene-containing membrane, a toluene solution of $C_{60}$-PCBN is applied with a bar coater and then dried to form an electron transport layer. Subsequently, a chlorobenzene solution containing P3HT and $C_{60}$-PCBM is applied with a bar-coater, and dried at 100° C. for 20 minutes to form a photo-electric conversion layer.

One surface of a stainless steel foil provided with an insulating ceramic film formed on the other surface is treated with diluted hydrochloric acid to remove the surface oxide film, and then spin-coated with the above iso-propanol dispersion of nitrogen-substituted graphene to form a nitrogen-substituted graphene-containing membrane. Thereafter, the procedure of Example 5 is repeated to produce a solar cell.

The thus-produced solar cell shows an energy conversion efficiency of 5% or more under 1 SUN solar light illumination, and the efficiency deteriorates by less than 3% even after the solar cell is left outdoor for 1 month.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

DESCRIPTION OF THE REFERENCE NUMERALS

101: graphene-containing membrane
102: working electrode
104: aqueous solution containing anions
105: seal
106: cylinder
107: counter electrode
108: reference electrode
109: power supply
111: ammeter
20: solar cell
201: transparent electrode
202: first graphene-containing membrane
203: photoelectric conversion layer
204: second graphene-containing membrane
205: counter electrode
30: organic EL device
301: transparent electrode
302: first graphene-containing membrane
303: photoelectric conversion layer
304: second graphene-containing membrane
305: counter electrode
50: solar cell
501: PET film
502: layered structure of ITO/silver alloy/ITO
503: graphene-containing membrane
504: electron transport layer
505: photoelectric conversion layer
506: stainless steel foil
507: N-graphene-containing membrane
508: adhesive layer
509: UV-cut layer
511: gas-barrier layer
60: organic EL device
601: PET film
602: layered structure of ITO/silver alloy/ITO
603: N-graphene-containing membrane
604: photoelectric conversion layer
605: hole transport layer
606: gold electrode

The invention claimed is:
1. A method for evaluating anion-permeability of a graphene-containing membrane comprising:
(i) preparing a measuring apparatus which comprises an aqueous solution containing anions, a working electrode containing silver-metal, a counter electrode and a reference electrode and in which said working electrode, said counter electrode and said reference electrode are electrically connected through an external circuit;

(ii) measuring the reaction current $I_0$ between the silver-metal and the anions while the electrode potential of said working electrode to said counter electrode is being periodically changed and driven under the condition that said working electrode, said counter electrode and said reference electrode are in contact with said aqueous solution;

(iii) measuring the reaction current $I_1$ between the silver-metal and the anions while the electrode potential of said working electrode to said counter electrode is being periodically changed and driven under the condition that, instead of said working electrode, the graphene-containing membrane electrically connecting to said working electrode is in contact with said aqueous solution and that said working electrode is not directly in contact with said aqueous solution; and (iv) comparing the reaction currents $I_0$ in (ii) and $I_1$ in (iii) so as to evaluate anion-permeability of said graphene-containing membrane.

2. The method according to claim 1, wherein said working electrode is in the shape of a film.

3. The method according to claim 1, wherein said working electrode is further equipped with such a protective film as keeps said working electrode from direct contact with said aqueous solution.

4. The method according to claim 1, wherein said anions are halogen ions or hydroxide ions.

5. The method according to claim 1, wherein said working electrode containing silver-metal is a thin film of silver metal or is made of silver nanowires.

* * * * *